United States Patent [19]
Ochiai et al.

[11] Patent Number: 4,851,792
[45] Date of Patent: Jul. 25, 1989

[54] TEMPERATURE-COMPENSATED OSCILLATOR CIRCUIT

[75] Inventors: Osamu Ochiai; Fujio Tamura, both of Miyagi, Japan

[73] Assignee: Seiko Electronic Components Ltd., Miyagi, Japan

[21] Appl. No.: 54,855

[22] Filed: May 27, 1987

[30] Foreign Application Priority Data

May 28, 1986 [JP] Japan .................. 61-123896

[51] Int. Cl.$^4$ ................... H03L 1/02; H03B 5/32
[52] U.S. Cl. ...................... 331/176; 331/66; 331/158; 331/177 V; 331/DIG. 3
[58] Field of Search .......... 331/66, 158, 176, 177 R, 331/177 V, DIG. 3; 357/23.5, 23.6

[56] References Cited

U.S. PATENT DOCUMENTS 4,583,059  4/1986  Konno ........................ 331/158

FOREIGN PATENT DOCUMENTS 2284219  4/1976  France .
2466899  4/1981  France .
2549656  1/1985  France .
60-147169  8/1985  Japan .

OTHER PUBLICATIONS

Patent Abstracts of Japan, vol. 8, No. 119 (E-248) [1556], Jun. 5, 1984 & JP-A-59 33 906 (Nippon Denki K.K.) 02-24-1984.
XIth International Congress of Chronometry dated Oct. 4-6, 1984, pp. 4, 9-12, Article Entitled "Application of Floating MOS Variable Capacitor for the Watch IC" by Y. Hattori, R. Matuszaki, K. Tanaka and A. Watanabe.
Article entitled "Miniaturized High-Accuracy Crystal Oscillator with Electrically Adjustable Frequency", JEE, Jan. 1986, pp. 32-34 and 36 by O. Ochiai, Y. Mashimo and F. Tamura.

Primary Examiner—David Mis
Attorney, Agent, or Firm—Bruce L. Adams; Van C. Wilks

[57] ABSTRACT

A temperature-compensated oscillator circuit utilizes a quartz oscillator for producing an oscillating signal having a variable oscillator frequency which fluctuates in response to ambient temperature change. A variable semiconductor capacitor having a variable capacitance is connected to the quartz oscillator for regulating the oscillating frequency thereof according to the variable capacitance. The variable semiconductor capacitor comprises a semiconductor substrate, a floating electrode disposed on and electrically insulated from the semiconductor substrate, an injection electrode formed in the semiconductor substrate for injecting a given amount of electric charge into the floating electrode to set the value of the variable capacitance, and a capacitance electrode formed in the semiconductor substrate and receptive of a bias voltage effective to adjust the set value of the variable capacitance. A control circuit detects ambient temperature change and produces a bias voltage according to the detected ambient temperature change and applies the bias voltage to the variable semiconductor capacitor to thereby enable the same to compensate the oscillating frequency for the temperature change.

24 Claims, 8 Drawing Sheets $V_I$ : INJECTION VOLTAGE

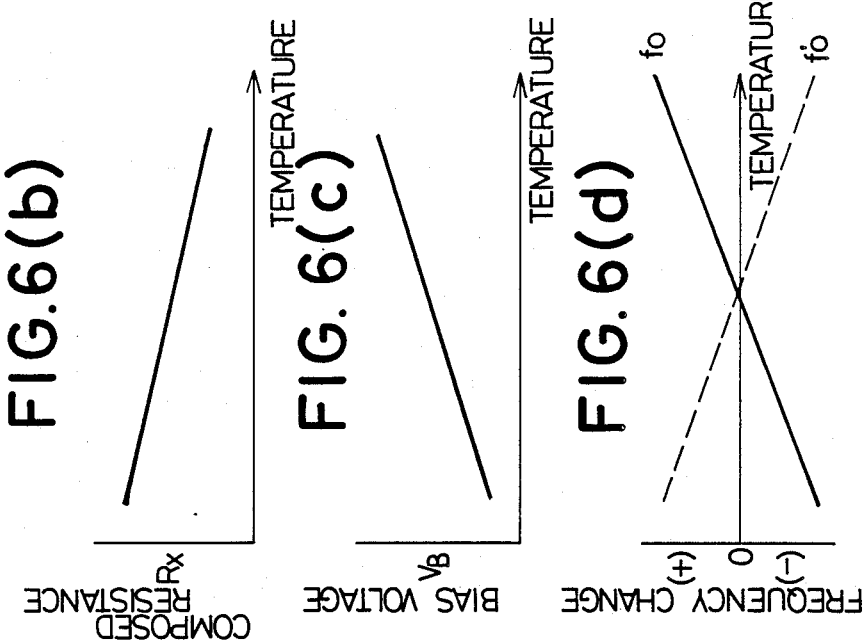
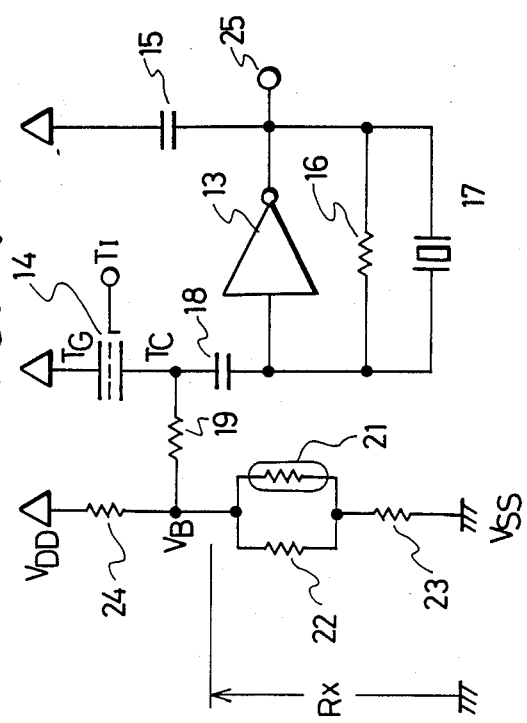

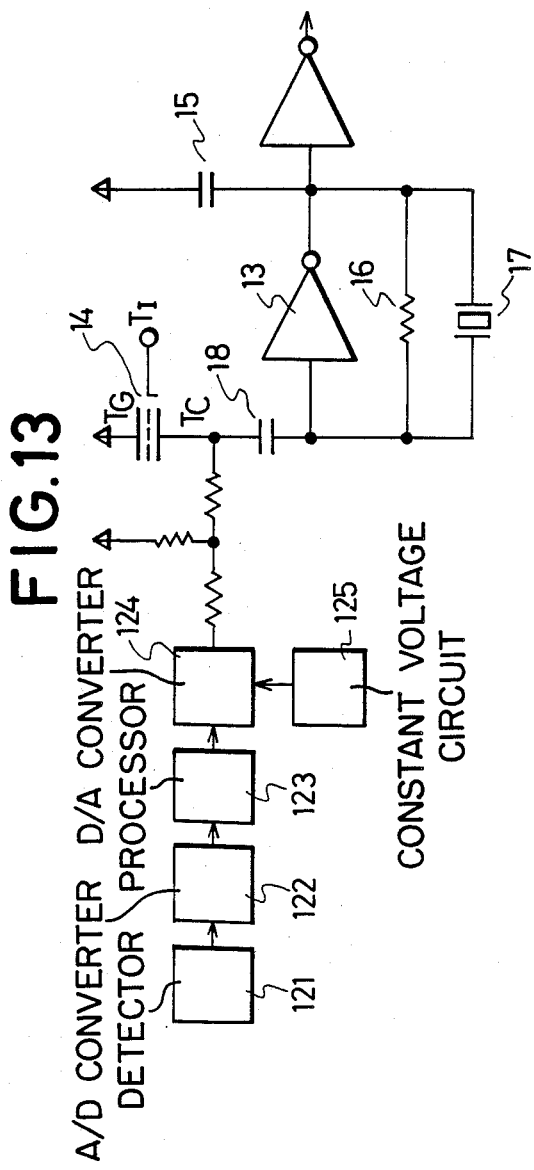

TEMPERATURE-COMPENSATED OSCILLATOR CIRCUIT

BACKGROUND OF THE INVENTION

1. Field of the Invention

The present invention relates to a Frequency-Temperature-Compensated circuit of Quartz Qrystal Oscillator.

2. Description of the Prior Art

Quartz Qrystal Oscillators are widely used in various field because of its excellent frequency stability. However, the Quartz Qrystal Oscillators for mobile Radio communication systems are required very high frequency stability, miniature size and low consumption.

The frequency stability of the quartz crystal oscillator means the frequency tolerance at room temperature and the frequency stability versus ambient temperature.

In the highly accurate crystal oscillator, following means are essential; a fine frequency adjusting means using a trimmer capacitor and a frequency-temperature compensating means for improving the frequency-temperature characteristic of a quartz crystal resonator in combination with a voltage-dependent electric element such as a variable capacitance diode and a temperature-dependent electric element such as a thermistor. A trimmer capacitor, however, has such drawbacks due to its mechanical structure as; unstability in capacitance especially for a miniaturized type and large size for a high capacitance-stability type. These make realization of a miniaturized highly accurate and stable quartz crystal oscillator very difficult.

To solve the above drawbacks, a floating gate MOS variable capacitor was recently invented and has been introduced to the quartz crystal oscillators. In this capacitor, the capacitance can be varied electrically by injecting electrons into the floating gate, through a thin insulating film, and, hence, the capacitance is kept constant after completing the injection of electrons into the floating gate.

Details of this capacitor has been disclosed in the following papers; Y. Hattori and R. Matsuzaki, "Application of Floating MOS variable Capacitor for the Watch IC.", Proceedings of 11th International Congress of Chronometry, P9 to 12, 1984, and "Miniaturized High-Accuracy Crystal Oscillator With Electrically Adjustable Frequency", J.E.E.,P32 to 36, January, 1986. By using this variable capacitor, a miniaturized high accuracy quartz crystal oscillator with a capability of electrical frequency adjustment was realized. It should be noted, however, that frequency-temperature dependence of the oscillator itself can not be adjusted merely by injecting electrons into the floating gate of this variable capacitor. Therefor, a variable capacitance diode must be added to compensate the frequency-temperature characteristic beside this variable capacitor. This results in increase in the number of components and thus in an increase in size of the oscillator and the production cost.

SUMMARY OF THE INVENTION

It is an object of the present invention to provide a frequency temperature-compensated oscillator circuit which is capable of adjusting frequency electrically and of compensating frequency-temperature characteristics at the same time.

It is another object of the present invention to provide a very small-size, high precision quartz crystal oscillator.

This invention contributes realization of the oscillators which meet today's increasingly sophisticated needs as a reference signal source in diverse fields, such as mobile radio communication equipments.

The above and other objects and features of the invention will appear more fully hereinafter from a consideration of the following description taken in connection with the accompanying drawings wherein several embodiments are illustrated by way of example.

BRIEF DESCRIPTION OF THE DRAWINGS

FIG. 6(a) shows one embodiment of the present invention; FIGS. 6(b) to 6(d) are diagrams for explaining the mechanism of frequency-temperature compensation in the present invention.

FIGS. 12 and 13 show other embodiments of the present invention in which the bias voltage applied to the variable capacitor is controlled with a micro-computer.

DETAILED DESCRIPTION OF THE INVENTION

Figure 1:
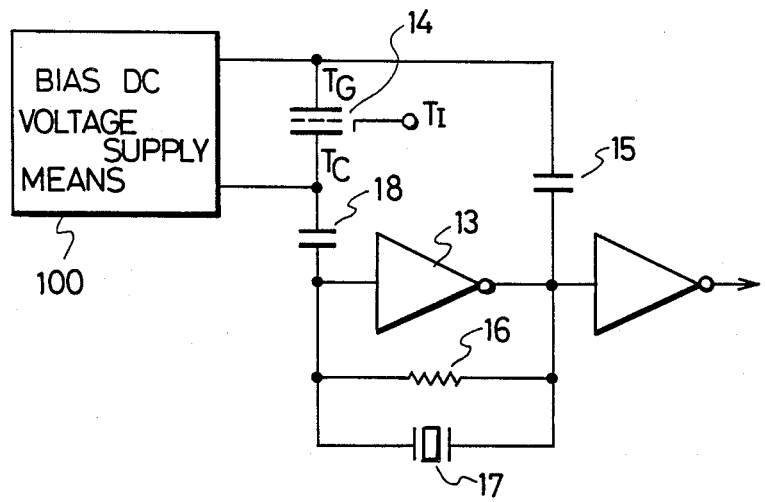
FIG. 1 shows a principle block diagram of the temperature-compensated oscillator circuit of this invention.

FIG. 1 is a block diagam of a temperature-compensated oscillator circuit of this invention.

As illustrated in FIG. 1, the temperature-compensated circuit comprises a oscillator circuit equipped with a floating gate MOS variable capacitor 14 and a bias DC voltage supply means 100. The capacitor 14 has a three-terminal structure of an injection terminal $T_I$, a capacitance terminal $T_C$ and a ground terminal $T_G$. The oscillation frequency is adjusted by applying the voltage to the injection terminal $T_I$, and is temperature-compensated by automatically controlling the bias DC voltage between the capacitance terminal and the ground terminal, according to variation or change in the ambient temperature.

Figure 2:
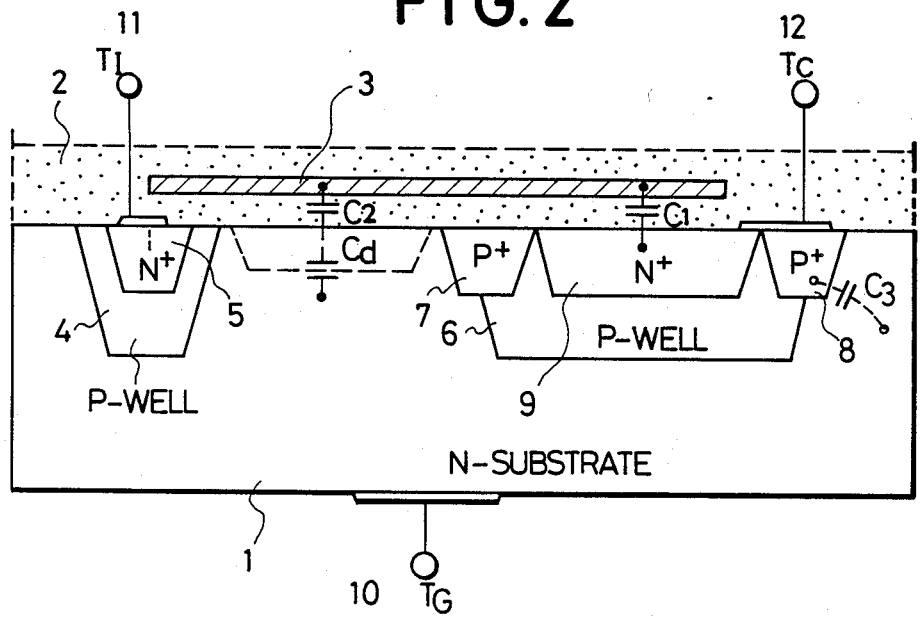
FIG. 2 shows a sectional structure of a floating gate MOS variable capacitor.

FIG. 2 is a sectional view showing the structure of the floating gate MOS variable capacitor 14.

Figure 3A:
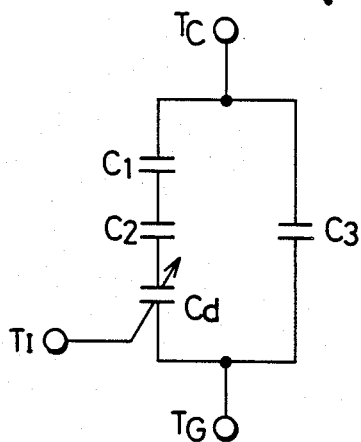
FIG. 3(a) shows an equivalent electric circuit of the variable capacitor.
Figure 3B:
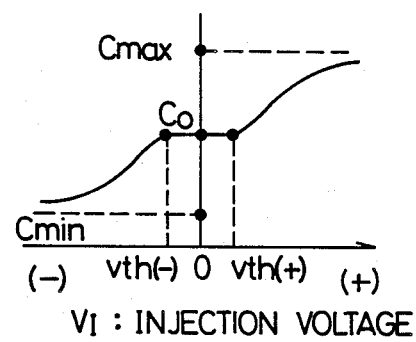
FIG. 3(b) schematically shows the relation between the injection voltage and capacitance of the variable capacitor.

FIG. 3(a) shows an equivalent electric circuit of the capacitor 14. FIG. 3(b) schematically shows the relation between the injection voltage and capacitance of the capacitor 14.

Designated by reference numeral 1 in FIG. 2 is an N-substrate made of N-type silicon, which is formed with lowly doped P-wells 4 and 6, highly doped N+-regions 5 and 9, and highly doped P+-regions 7 and 8. The N-substrate 1 is covered with a silicon dioxide thin film 2, in which is buried a floating electrode (FE) 3 made of polycrystalline silicon. A ground terminal or electrode ($T_G$) 10 is connected to the back of the N-substrate 1; an injection terminal or electrode ($T_I$) 11 is connected to the N+-region 5; and a capacitance terminal or electrode ($T_C$) 12 is connected between the N+-region 9 and P+-region 8. The capacitance (Cp) between the capacitance terminal 12 and the ground terminal 10 consists of capacitance ($C_1$) between the N+-region 9 and the floating electrode 3; the capacitance ($C_2$) between the upper surface of the N-substrate 1 and the floating electrode 3; the capacitance $C_d$ of a depletion region formed between the upper surface of the N-substrate 1 and the substrate 1; and the capacitance ($C_3$) of another depletion region formed between the P+-region 8 and the substrate 1, as shown in an equivalent circuit of FIG. 3(a). The gap between the surface of the N+-type region 4 and the floating electrode 3 is maintained at about 100° Å. Electrons are ejected through tunnel current channels in the thin oxide film 2 from the floating electrode 3, if a positive voltage is applied between the injection terminal 11 and the ground terminal 10 (herein after refered to as an injection voltage) and, on the contrary, electrons are injected if a negative injection voltage is applied. Once injected or ejected, electrons are semipermanently retained in the floating electrode 3, even after the injection voltage is removed.

Even if no charge is injected into the floating electrode 3, an electric field is generated, due to the difference in work function between the silicon and the oxide film, between the floating electrode 3 and the upper surface of the substrate 1 so that the depletion region capacitance $C_d$ takes a certain value. At this time, the total capacitance of the capacitor takes a value $C_0$ (as shown in FIG. 3(b)). As electrons are ejected from the floating electrode, the depletion region formed below the floating electrode 3 becomes narrow until it desappears. As a result, the total capacitance is determined by $C_1$, $C_2$ and $C_3$ to approach the maximum capacitance $C_{max}$ (as shown in FIG. 3(b)). If electrons are injected into the floating electrode 3, on the other hand, the positive charges are concentrated to the upper surface of the substrate 1 so that the depletion region is enlarged to reduce the capacitance $C_d$. Since the positive charges gather all over the surface of the substrate 1, the capacitance $C_d$ will not vary any more even if electrons are injected more into the floating electrode 3. As a result, the total capacitance $C_P$ approaches the minimum capacitance $C_{min}$ (as shown in FIG. 3(b)). Here, in order to inject the electrons through the thin oxide film 2, an electric field is required to have a given constant intensity or more. This leaves a range from Vth (+) to Vth (−) of FIG. 3(b), in which the total capacitance is not changed even if the injection voltage is varied.

Figure 4A:
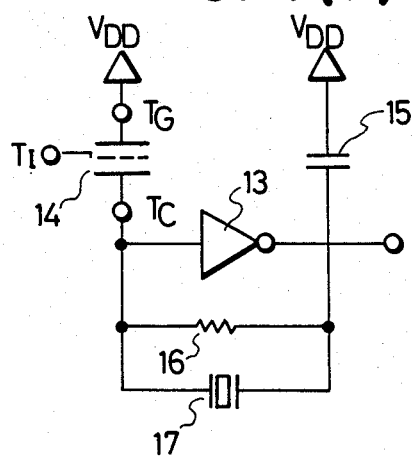
FIG. 4(a) shows the quartz crystal oscillator circuit with the variable capacitor which is used only for adjustment of oscillation frequency.

FIG. 4(a) shows the oscillation circuit using the variable capacitor 14 which is used only for frequency adjustment.

Reference numeral 13 designates an inverter; numeral 14 designates a floating gate MOS voriable capacitor; numeral 15 designates an output side load capacitor; numeral 16 designates a feedback resistor; and numeral 17 designates a quartz crystal oscillator. To adjust oscillation frequency, the capacitor 14 is, for instance, inserted to the gate side of the inverter 13. Ground terminal $T_G$ is connected to a positive side ($V_{DD}$) of the power source and capacitance terminal $T_C$ is connectied to the gate of the inverter 13.

An injection voltage $V_I$ is applied between the injection terminal $T_I$ and the $V_{DD}$. Since the capacitance can be set larger than the constant value $C_0$ by ejecting electrons, as has been described above, the oscillation frequency can be reduced. On the contrary, the oscillation frequency can be increased by injecting electrons.

Figure 4B:
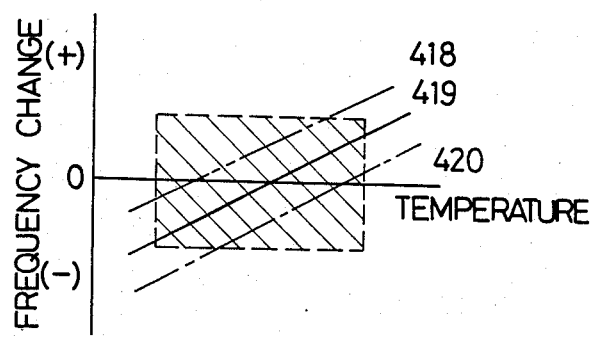
FIG. 4(b) shows the effect of frequency adjustment to satisfy the requirement in frequency stability of an oscillator over the temperature.

The effect of frequency adjustment is explained in FIG. 4(b). In FIG. 4(b), a hatched zone represents an allowable frequency change satisfying a predetermined frequency-temperature standard, and straight lines 418 and 420 which represent frequency-temperature characteristics of the quartz crystal oscillator do not satisty that zone, but the line 418 can be changed to a straight line 419 which falls within the zone by changing the injection voltage of the capacitor. Another unsatisfied line 420 also can be changed to the line 419 by a similar way. However, in an oscillator having not so excellent frequency-temperature characteristic like the line 419, margin to the predetermined frequency-temperature characteristic can not be enlarged only by adjusting the frequency, but can be enlarged by changing frequency-temperature characteristic itself. This is the reason the frequency-temperature compensation is required.

Figure 5A:
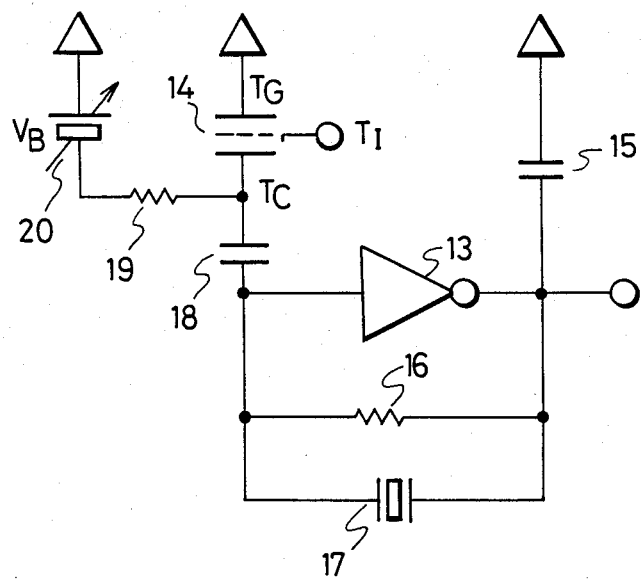
FIG. 5(a) is a schematic oscillation circuit to explain the principle of the present invention.
Figure 5B:
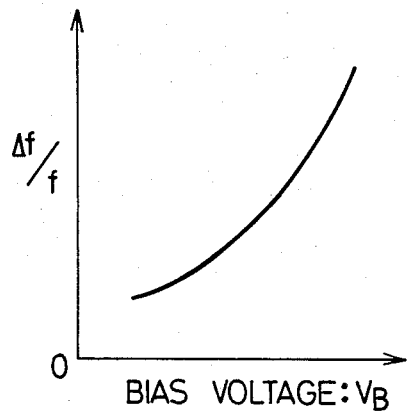
FIG. 5(b) shows the relation between frequency change of the oscillator and bias voltage applied to the variable capacitor.

FIG. 5(a) shows a schematic circuit to explain the principle of the present invention. Bias voltage is applied to the capacitance terminal $T_C$ via resister 19. FIG. 5(b) shows relation between bias voltage $V_B$ and change in oscillation frequency. In FIG. 5(a), reference numeral 18 designates a capacitor for cutting out a DC current and numeral 19 designates a resistor for blocking a high frequency signal from the power source. As shown in FIG. 3(a), the capacitor $C_3$ denotes the depletion region capacitance of the parasitic diode formed between the capacitance terminal $T_C$ (P+ region 8) and the ground terminal $T_G$ (N region) of the variable capacitor. The capacitance $C_3$ can be changed by varying the bias voltage $V_B$ applied between the terminal $T_C$ and the terminal $T_G$. In this embodiment, when the bias voltage $V_B$ is raised, the depletion region capacitance $C_3$ is reduced and the oscillation frequency is increased as shown in FIG. 5(b).

FIG. 6(a) shows a preferred embodiment of the present invention and FIGS. 6(b) to 6(d) are diagrams for explaining the operations of the embodiment. In FIG. 6(a): reference numeral 21 designates a thermistor having a negative temperature coefficient; numeral 22 designates a resistor for relaxing the resistance-temperature characteristic of the thermistor; numerals 23 and 24 designate resistors for properly determining the bias voltage $V_B$ together, with the thermistor 21 and resistor 22, and letters $R_X$ designate a composed resistance of the thermistor 21 and resistors 22 and 23. As shown in FIG. 6(b), the resistance of the thermistor 21 drops with the rise of the ambient temperature so that the composed resistance $R_X$ drops. At this time, the bias voltage $V_B$ increases with the rise of the ambient temperature, as shown in FIG. 6(c), with reference to the power supply voltage $V_{DD}$. As a result, the total capacitance $C_P$ of the capacitor 14 drops, but the oscillation frequency increases, as shown by a solid line f'$_0$ in FIG. 6(d). Therefore, if the frequency-temperature characteristic of the quartz crystal oscillator is indicated by a broken line f$_0$ in FIG. 6(b), the frequency of the output signal of the output terminal 25 of the quartz crystal oscillation circuit shown in FIG. 6(a) does not vary in the least even if the ambient temperature varies; that is, the oscillation frequency has been compensated for the temperature. According to the present invention, as the bias voltage to the capacitance terminal $T_C$ of the variable capacitor 14 automatically varies in accordance with the ambient temperature, the total capacitance $C_P$ of the variable capacitor 14 varies, and thus oscillation frequency is compensated almost independently of the frequency adjustment using a single floating gate MOS variable capacitor 14.

Figure 7:
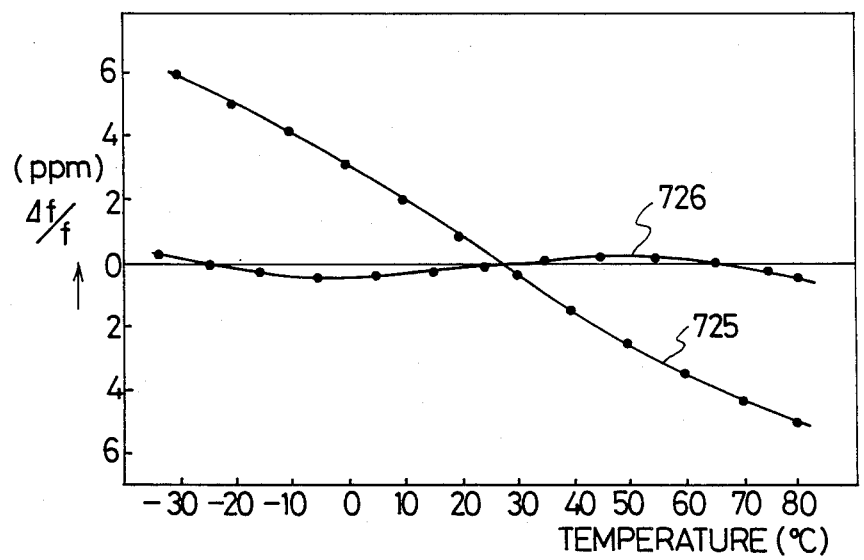
FIG. 7 shows resulting curves of frequency-temperature characteristic of a non-temperature-compensated oscillator and of a temperature compensated one.

FIG. 7 shows an example of the measured temperature characteristics of the oscillation frequency in the embodiment of the present invention. In the present embodiment, as shown in FIG. 6(a): $R_{22}=15$ KΩ; $R_{23}=33$ KΩ; $R_{24}=15$ KΩ; $R_{19}=47$ KΩ; $C_{15}=15$ PF; $C_{18}=200$ PF; $R_{16}=5$ MΩ; $V_{DD}=1.85$ V; and the quartz crystal oscillation element is a GT cut oscillation element of 2.1 MHz. In FIG. 7, a curve 725 shows the temperature characteristics of the frequency of the quartz crystal oscillator without the temperature compensation, and a curve 726 shows the temperature characteristics of the oscillation frequency when the temperature compensation is conducted according to the present invention. In the present embodiment, there is presented a method of temperature compensation in case the temperature coefficient of the frequency of the quartz crystal oscillator is negative. (that is, the frequency decreases in accordance with increase in temperature.) When the frequency-temperature coefficient of the quartz oscillator is positive (that is, the frequency increases in accordance with increase in temperature), it is quite apparent from the description of FIG. 5(b) that the temperature compensation can be accomplished absolutely similarly by connecting the resistor 24 to the $V_{SS}$ and connecting the composed resistance of the thermistor 21 and the resistors 22 and 23 to the $V_{DD}$.

Figure 8A:
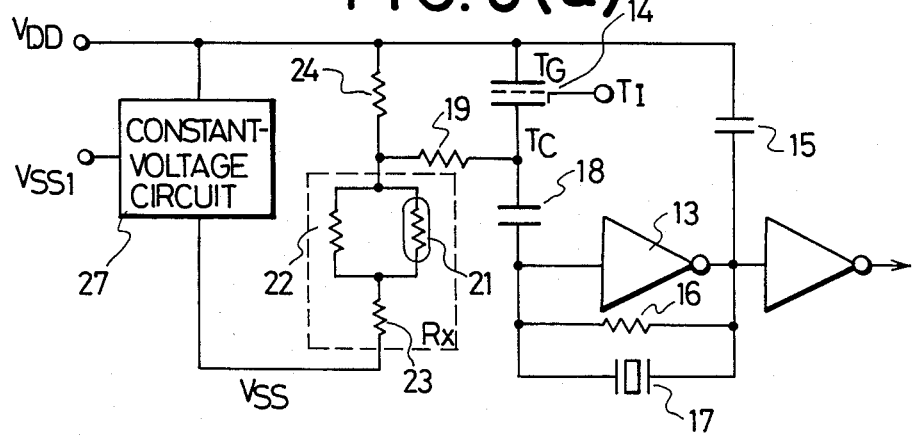
FIG. 8(a) shows another embodiment of the present invention in which the thermistor-resistor network is driven with a constant voltage circuit.
Figure 8B:
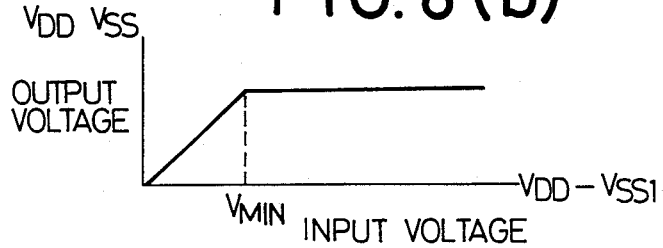
FIG. 8(b) shows the voltage regulation characteristic of the constant voltage circuit.

FIG. 8(a) shows another embodiment of the present invention. In FIG. 8(a) showing the structure of this embodiment, a constant voltage circuit 27 is connected between the power supply voltages $V_{DD}$ and $V_{SS1}$ to generate the power supply voltage $V_{DD}$-$V_{SS}$ of the oscillation circuit. FIG. 8(b) schematically shows the relation between the output voltage $V_{DD}$-$V_{SS}$ and input voltage $V_{DD}$-$V_{SS1}$ of the constant voltage circuit. For the input voltage higher than $V_{min'}$ the output voltage $V_{DD}$ -$V_{SS}$ is not changed even if the input voltage $V_{DD}$-$V_{SS1}$ varies. As a result, as shown in FIG. 8(a), the bias voltage $V_B$ of the capacitor 14 remains constant even if the power supply voltage $V_{DD}$-$V_{SS1}$ varies, so that neither the oscillation frequency nor the frequency-temperature characteristics varies. This is important for implementing the frequency-temperature compensating means according to the present invention.

Figure 9:
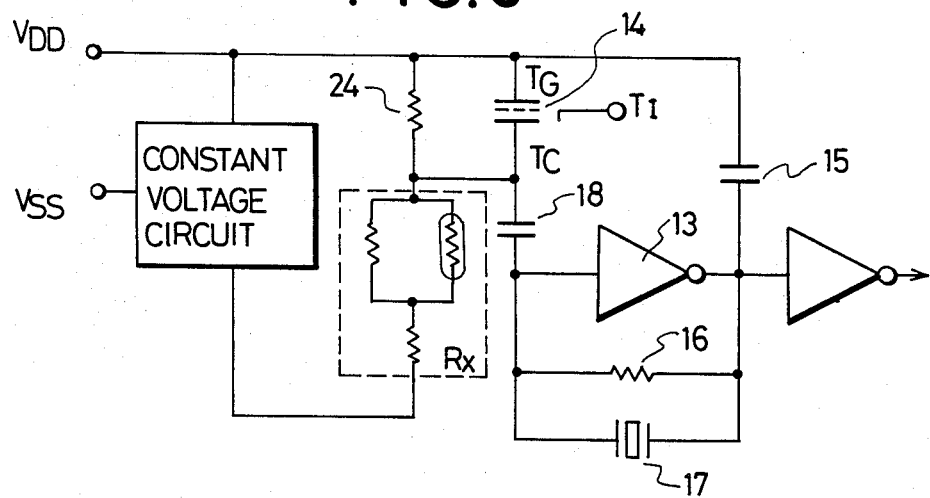
FIGS. 9 and 10 show other embodiments of the present invention in which the thermistor-resistor networks are simplified for miniaturization of the oscillator.
Figure 10:
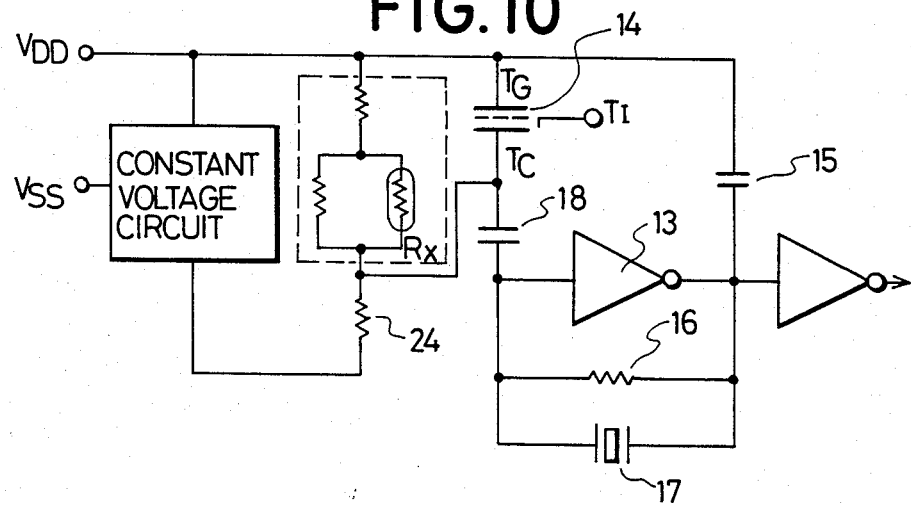
Figure 11:
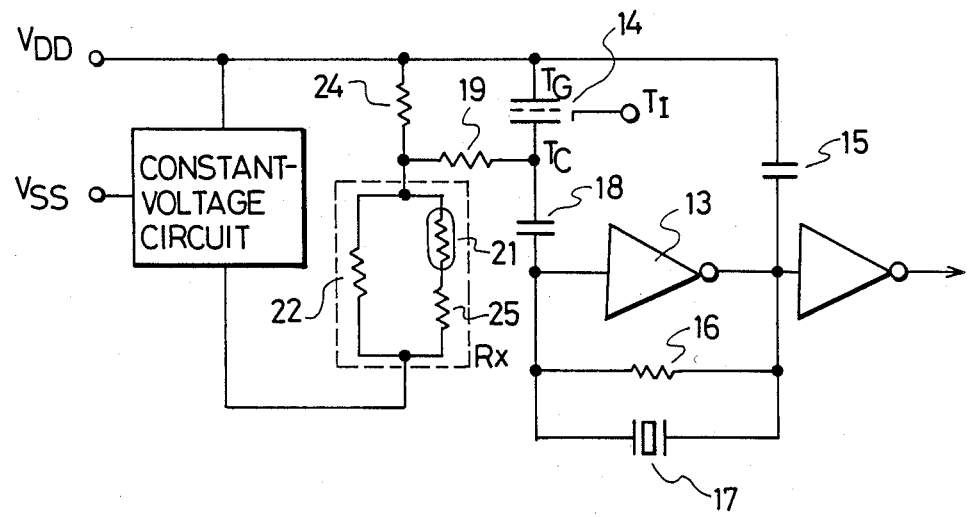
FIG. 11 show another embodiment of the present invention in which the thermistor-resister network is modified for optimization of the temperature compensation.

FIGS. 9, 10 and 11 show other preferred embodiments of the invention. In FIG. 9, the oscillator circuit is directly connected to the resistor network $R_X$ and fixed resistor 24, i.e., being not connected through a resistor 19. In this circuit, as temperature rises the bias voltage of the capacitor 14 will increase, and oscillation frequency will become high. Therefore, temperature characteristics of the resonator having a primary negative temperature coefficient can be compensated. On the other hand, in FIG. 10, temperature characteristics of the resonator having a primary positive temperature coefficient can be compensated. Moreover, the resistor network $R_X$ including a thermistor may be comprised of a fixed resistor 22 connected in parallel to the thermistor 21 connected in series with a fixed resistor 25 as shown in FIG. 11.

Figure 12:
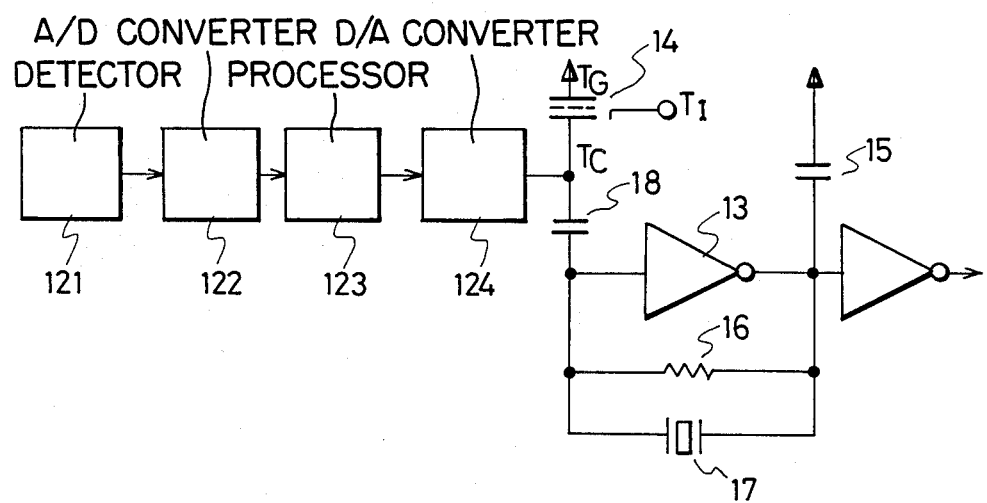

Further embodiments of the invention is illustrated in FIGS. 12 and 13. As shown in FIG. 12, the temperature-compensated oscillator circuit includes a temperature-voltage voltage converter 121 for converting ambient temperature into a direct bias voltage, an A/D converter 122 for converting the analog output signals of the temperature-voltage converter 121 into the digital signals, a computer 123 which caluculate the amount of frequency to be compensated and determines a necessary value of DC bias voltage to be applied to the floating gate MOS variable capacitor and which generates degital signals corresponding to the bias voltage and a D/A converter 124 for converting the degital signals generated by the computer 123 into analog signals of a direct bias voltage to be applied to the floating gate MOS variable capacitor. In FIG. 13, the reference numeral 125 denotes a constant-voltage circut for operating the D/A converter 124.

As explained before, in the above enbodiments, the DC bias voltage applied to the terminal $T_C$ is calculated in the computer based on the reference values stored therein in advance.

As has been described hereinbefore, according to the present invention, the temperature compensation of the oscillation frequency can be executed remarkably easily by using the floating gate MOS variable capacitor which can have its capacitance electrically varying permanently when electric charges are injected into the floating electrode, and by varying another depletion layer capacitance of the parasitic diode of the variable capacitor automatically accordance with the ambient temperature with use of thermistor-resistor network. Since both the frequency adjustment and the adjustment of the frequency-temperature characteristics can be performed by the single variable capacitor without using the variable capacitance diode according to the present invention, there is implemented a remarkably miniatuarized highly accurate quartz crystal oscillator which has a remarkably high frequency accuracy and least changes in the frequency due to the temperature. By stabilizing the power source voltage of the quartz crystal oscillation circuit having the frequency-temperature compensation effected according to the present invention, moreover, it is possible to provide a stable quartz crystal oscillator which has its oscillation frequency and frequency-temperature characteristics stable even if the power supply voltage fluctuates. Thus, the present invention can provide many effects for implementing the highly accurate quartz crystal oscillator.

Having described out invention as related to the embodiment shown in the accompanying drawings, the invention be not limited by any of the details of description, unless otherwise specified, but rather be construed broadly within its spirit and scope as set out in the accompanying claims.

What is claimed is:

1. A temperature-compensated oscillator circuit comprising: an oscillator circuit including a quartz crystal oscillator, a DC cut capacitor connected to the quartz crystal oscillator, and a floating gate MOS variable capacitor connected to the DC cut capacitor, said floating gate MOS variable capacitor having a three-terminal structure comprised of an injection terminal, a capacitance terminal and a ground terminal; and means for supplying a bias DC voltage between the capacitance terminal and the ground terminal, said means including means for varying the bias DC voltage according to temperature fluctuation.

2. A temperature-compensated oscillator circuit as claimed in claim 1; wherein said means for varying the bias DC voltage comprises a thermistor.

3. A temperature-compensated oscillator circuit as claimed in claim 2; wherein said means for supplying a bias DC voltage comprises a constant-voltage circuit, and a resistor network including the thermistor and a first fixed resistor having a given fixed resistance, said bias DC voltage to be applied to the floating gate MOS variable capacitor being determined by the resistance ratio of the resistor network and the first fixed resistor.

4. A temperature-compensated oscillator circuit as claimed in claim 3; wherein the resistor network has a plurality of fixed resistors having fixed resistances.

5. A temperature-compensated oscillator circuit as claimed in claim 3; wherein the resistor network includes a composite resistor and a second fixed resistor having a fixed resistance and connected in series with the composite resistor, said composite resistor comprising the thermistor and a third fixed resistor having a fixed resistance and connected in parallel to the thermistor.

6. A temperature-compensated oscillator circuit as claimed in claim 5; wherein the oscillator circuit is connected through a fourth fixed resistor having a fixed resistance to the resistor network and the first fixed resistor.

7. A temperature-compensated oscillator circuit as claimed in claim 3; wherein the resistor network comprises a composite resistor and a second fixed resistor having a fixed resistance and connected in parallel to the composite resistor, the composite resistor comprising the thermistor and a third fixed resistor having a fixed resistance and connected in series with the thermistor.

8. A temperature-compensated oscillator circuit as claimed in claim 7; wherein the oscillator circuit is connected through a fourth fixed resistor having a fixed resistance to the resistor network and the first fixed resistor.

9. A temperature-compensated oscillator circuit as claimed in claim 7; wherein a drive voltage of the oscillator circuit is supplied by a constant-voltage circuit.

10. A temperature-compensated oscillator circuit as claimed in claim 1; wherein the floating gate MOS variable capacitor has a semiconductor substrate and a floating electrode above the surface of the semiconductor substrate for controlling the capacitance of the floating gate MOS variable capacitor.

11. A temperature-compensated oscillator circuit as claimed in claim 10; wherein the capacitance of the floating gate MOS variable capacitor is controlled by electric charge accumulated on the floating electrode on the surface of the semiconductor substrate.

12. A temperature-compensated oscillator circuit comprising: oscillator means for producing an oscillating signal having a variable oscillating frequency; variable capacitance means having a variable capacitance and being connected to the oscillating means for controlling the oscillating frequency thereof according to the variable capacitance, the variable capacitance means having a three-terminal structure comprised of an injection terminal, a capacitance terminal and a ground terminal and being operated by varying the capacitance between the capacitance terminal and the ground terminal; and bias voltage supplying means for supplying a bias voltage between the capacitance terminal and the ground terminal, said bias voltage supplying means including a resistor network having a thermistor effective to adjust the oscillating frequency for changes in temperature.

13. A temperature-compensated oscillator circuit as claimed in claim 12; including a first fixed resistor having a fixed resistance and connected in series with the resistor network and a second fixed resistor having a fixed resistance and connected between the variable capacitance means and the bias voltage supplying means, said bias voltage being determined by the resistance ratio of the resistor network and the first fixed resistor.

14. A temperature-compensated oscillator circuit comprising: an oscillator circuit including oscillating means for producing an oscillating signal having a variable oscillating frequency; a temperature-voltage converter for converting ambient temperature into an analog output signal composed of a first bias DC voltage; an analog-to-digital converter for converting the analog output signal of the temperature-voltage converter into a first digital signal; a computer for calculating a second digital signal from the first digital signal and for generating the second digital signal, said second digital signal being comprised of a bias DC voltage control signal effective to compensate for temperature-induced changes in the operation of the oscillator circuit; a digital-to-analog converter for converting the second digital signal into a second bias DC voltage; and a floating gate MOS variable capacitor receptive of the second bias DC voltage and having a variable capacitance regulated by the second bias DC voltage and being connected to the oscillating means for controlling the oscillating frequency thereof according to the variable capacitance.

15. A temperature-compensated oscillator circuit as claimed in claim 14; including a constant-voltage circuit for operating the digital-to-analog converter.

16. A temperature-compensated oscillator circuit comprising: oscillating means for producing an oscillating signal having a variable oscillating frequency which fluctuates in response to ambient temperature change; variable capacitive means having a variable capacitance and being connected to the oscillating means for regulating the oscillating frequency thereof according to the variable capacitance, the variable capacitive means comprising a semiconductor substrate, a floating electrode disposed on and electrically insulated from the semiconductor substrate, an injection electrode formed in the semiconductor substrate for injecting a given amount of electric charge into the floating electrode to set the value of the variable capacitance, and a capacitance electrode formed in the semiconductor substrate and receptive of a bias voltage effective to adjust the set value of the variable capacitance; and control means for detecting ambient temperature change and producing a bias voltage according to the detected ambient temperature change and applying the bias voltage to the variable capacitive means to thereby enable the same to compensate the oscillating frequency for the temperature change.

17. A temperature-compensated oscillator circuit as claimed in claim 16; wherein the variable capacitive means includes a ground electrode connected to the semiconductor substrate to develop a variable capacitance across the capacitance electrode and the ground electrode.

18. A temperature-compensated oscillator circuit as claimed in claim 17; wherein the semiconductor substrate has a depletion capacitive region under the floating electrode, the capacitance value of which is settable according to the amount of electric charge injected into the floating electrode, and a parasitic capacitive region between the capacitance electrode and ground electrode, the capacitance value of which is adjustable according to the bias voltage applied to the capacitance electrode.

19. A temperature-compensated oscillator circuit as claimed in claim 17; including a DC cut capacitor connected between the capacitance electrode and the oscillating means for cutting out the bias voltage to thereby prevent the bias voltage from being applied to the oscillating means.

20. A temperature-compensated oscillator circuit as claimed in claim 16; wherein the control means comprises a voltage source for producing a predetermined voltage, and a resistor network comprised of a plurality of resistors for voltage-dividing the predetermined voltage to produce a bias voltage, the resistor network including a thermistor having a variable resistance responsive to the ambient temperature change and effective to determine the bias voltage according to the ambient temperature change.

21. A temperature-compensated oscillator circuit as claimed in claim 20; wherein the resistor network includes a fixed resistor having a fixed resistance for connecting the control means to the variable capacitive means to block a frequency signal contained in the bias voltage.

22. A temperature-compensated oscillator circuit as claimed in claim 20; wherein the voltage source comprises a constant voltage circuit for producing a predetermined constant voltage.

23. A temperature-compensated oscillator circuit as claimed in claim 16; wherein the control means includes a detector for detecting ambient temperature change to produce a corresponding detection signal, and a computer for calculating the value of the bias voltage according to the detection signal.

24. A temperature-compensated oscillator circuit as claimed in claim 23; wherein the control means includes an A/D converter for converting an analog detection signal into a corresponding digital signal for use in the computer, and a D/A converter for converting the calculated digital value of the bias voltage into a corresponding analog bias voltage.

* * * * *